United States Patent [19]
Matsuda

[11] 4,084,111
[45] Apr. 11, 1978

[54] APPARATUS FOR THE DIGITAL CONTROL OF ANALOG SIGNAL

[75] Inventor: Hirotoshi Matsuda, Osaka, Japan

[73] Assignee: New Nippon Electric Company, Ltd., Osaka, Japan

[21] Appl. No.: 635,640

[22] Filed: Nov. 26, 1975

[51] Int. Cl.² .......................................... H03K 1/14
[52] U.S. Cl. ................................. 307/264; 328/168
[58] Field of Search ............... 340/347 DA; 307/237, 307/264; 328/168, 172

[56] References Cited
U.S. PATENT DOCUMENTS

| | | | |
|---|---|---|---|
| 3,533,098 | 10/1970 | Munoz | 340/347 AD |
| 3,806,810 | 4/1974 | Widmer et al. | 340/347 DA |
| 4,020,485 | 4/1977 | Busby | 340/347 DA |

Primary Examiner—Thomas J. Sloyan
Attorney, Agent, or Firm—W. G. Fasse; W. W. Roberts

[57] ABSTRACT

A digital-analog converter electrically effecting sequential switching between a reference voltage point and each of the connection points formed in a circuit network composed of serially connected impedance elements for taking out desired analog quantity such as signal voltage level, impedance value or the like in response to the application of control pulses, which comprises in combination memory circuits such as R-S flip-flops, gate circuits such as NAND gates and delay circuit such as integration circuits, capacitors and the likes. The provision of the delay circuits, in particular, advantageously facilitates the setting for the initial operation state and the preparation for the sequential switching.

13 Claims, 6 Drawing Figures

|  | F₁ | | F₂ | | F₃ | | F₄ | |
|---|---|---|---|---|---|---|---|---|
|  | Q₁₁ | Q₁₂ | Q₂₁ | Q₂₂ | Q₃₁ | Q₃₂ | Q₄₁ | Q₄₂ |
| (8) | L | H | L | H | L | H | L | H |
| (1)or(7) | H | L | L | H | L | H | L | H |
| (2)or(6) | H | L | H | L | L | H | L | H |
| (3)or(5) | H | L | H | L | H | L | L | H |
| (4) | H | L | H | L | H | L | H | L |
FIG.2
| | G₁₁ | | G₁₂ | | G₂₁ | | G₂₂ | | G₃₁ | | G₃₂ | | G₄₁ | | G₄₂ | |
|---|---|---|---|---|---|---|---|---|---|---|---|---|---|---|---|---|
| | g₁₁ | s₁₁ | g₁₂ | s₁₂ | g₂₁ | s₂₁ | g₂₂ | s₂₂ | g₃₁ | s₃₁ | g₃₂ | s₃₂ | g₄₁ | s₄₁ | g₄₂ | s₄₂ |
| (8) | L | L | H | L | L | L | H | L | L | L | H | L | L | L | L | L |
| (1)or(7) | L | L | H | L | H | L | H | L | L | L | H | L | L | L | L | L |
| (2)or(6) | L | L | L | L | H | L | H | L | H | L | H | L | L | L | L | L |
| (3)or(5) | L | L | L | L | H | L | L | L | H | L | H | L | H | L | L | L |
| (4) | L | L | L | L | H | L | L | L | H | L | L | L | H | L | L | L |
FIG.3
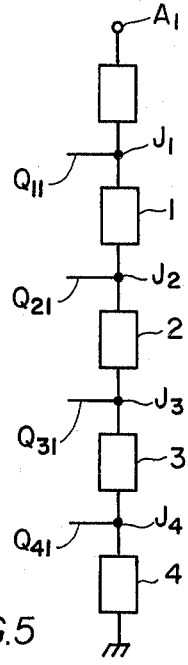
FIG.5
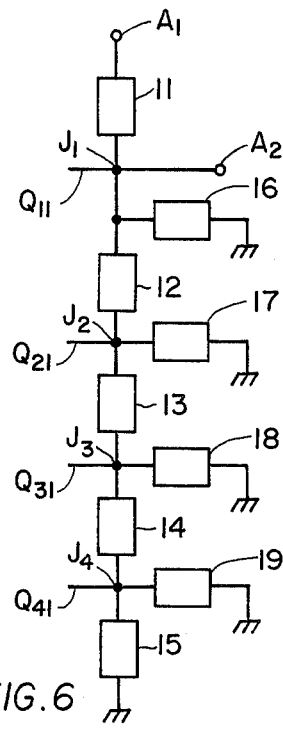
FIG.6

APPARATUS FOR THE DIGITAL CONTROL OF ANALOG SIGNAL

BACKGROUND OF THE INVENTION

This invention relates to an apparatus for the digital control of an analog signal and, in particular, to a circuit arrangement for varying an analog quantity such as voltage, an impedance or the like.

Adjustments of the audio volume, color saturation, contrast, brightness and the like in various receivers such as a television receiver are sometimes performed by the use of a remote control apparatus instead of manually operating each of the adjustment knobs provided as part of a receiver. In such a remote control adjustment, a transmitter and a receiver are usually employed for the remote control. The transmitter may be operated by a viewer and the receiver is incorporated in the cabinet of a television receiver proper. The transmitter of the remote control apparatus is manipulated by the television viewer to send instruction signals, which are aerially transmitted as ultrasonic waves or as electric waves or the transmission directly may be through wire means to the television receiver. Corresponding to the types of the instruction signals, the receiver of the remote control apparatus generates pulse-shaped control signals and applies these control signals to the circuits to be controlled such as a volume control circuit, a color saturation control circuit and the like. Since the above described circuits to be controlled are adapted to operate in such a manner that they vary their analog output such as a voltage, an impedance or the like in accordance with the number of pulses in the control signals, a digital control is conventionally used for controlling such circuits. The digital control devices of this type employed so far, are adapted to count and store the a number of pulses by means of an up-down counter, and to effect a switching among the electronic switches provided in a resistor circuit network in response to the counted output to thereby provide voltages from said resistor circuit network corresponding to said counted pulses. The digital control devices of the type described are, however, expensive and hence not suited for use in apparatus used in the home such as television receivers.

SUMMARY OF THE INVENTION

An object of this invention is to provide a simplified circuit for varying an analog quantity such as the voltage level of an AC current signal, a DC voltage level, an impedance value or the like.

Another object of this invention is to provide a circuit arrangement which is economical and suited for the mass production by the use of IC components.

A further object of this invention is to provide a circuit arrangement which is suitable for the remote control of the adjustment for the audio volume, the color saturation, the brightness or the like of a television receiver.

In this invention, for attaining the foregoing objects, a circuit network having a plurality of impedance elements, for instance, serially connected resistor elements, is connected to a further plurality of memory circuits, for example, composed of R-S flip-flops which correspond to each of the connection points between said impedance elements so as to apply a reference voltage or a ground potential to any one of said connection points. The memory circuits are adapted so that a "set" input signal is always applied to a set input terminal of the first memory circuit when a first control signal arrives and a reset input signal is always applied to the reset input terminal of the final memory circuit when a second control signal arrives. The set input terminals and the reset input terminals of other memory circuits are controlled by gate circuits. A voltage generated at one output terminal of a pair of output terminals of a memory circuit, is applied through a delay circuit to a gate circuit at the reset input of the succeeding memory circuit. A voltage generated at the other output terminal of said pair of output terminals is applied through a similar delay circuit to a gate circuit at the reset input of the preceeding memory circuit thereby providing input signals for each of the gates. The memory circuits of a plurality of stages are divided into two group. Each group is provided with optional stages including delay circuits for delaying the "set" input signals to the memory circuits of the group including the memory circuit of the first stage. Each group is further provided with delay circuits for delaying the "reset" inputs to the memory circuit of the group including the memory circuit of the final stage. These features establish the initial operation condition of the digital control circuit.

DESCRIPTION OF THE ACCOMPANYING DRAWINGS

FIG. 2 and FIG. 3 are truth tables for showing the operation conditions of the circuit in each of their stabilized stages;

FIG. 5 and FIG. 6 are examples for the circuit connections of the impedance circuit network for use in the circuit shown in FIG. 1 or in FIG. 2.

DESCRIPTION OF PREFERRED EMBODIMENTS

Figure 1:
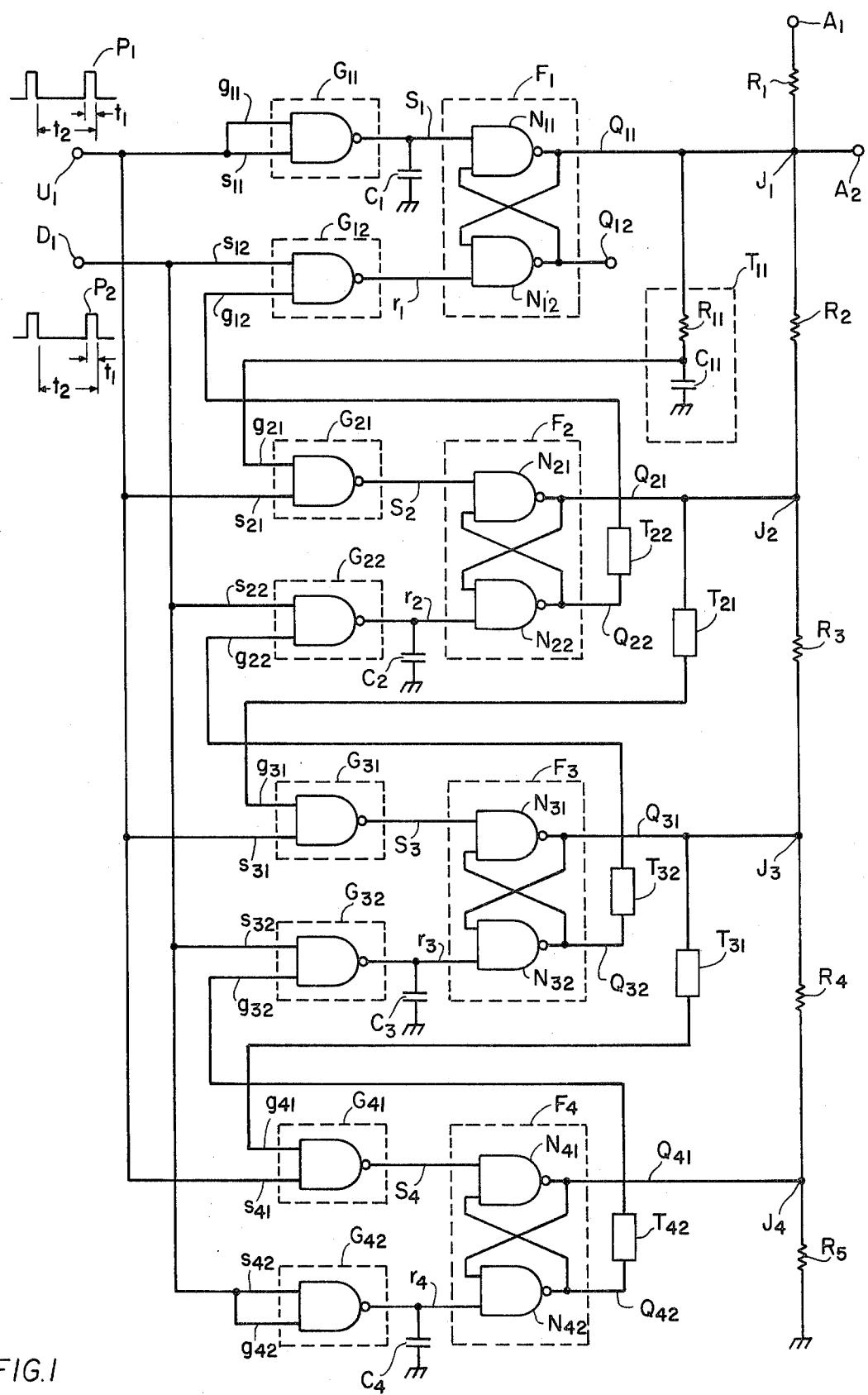
FIG. 1 is a circuit diagram of a preferred embodiment of this invention.

Referring to the circuit shown in FIG. 1, a terminal $A_1$ is an input terminal to which an audio signal voltage is applied for example. Resistors $R_1$ through $R_5$ are connected in series between the input terminal $A_1$ and ground. To each of the connection points $J_1$ to $J_4$ formed between adjacent resistors connected in series, is connected the respective terminal of the output terminals $Q_{11}$, $Q_{21}$, $Q_{31}$ and $Q_{41}$ of the circuits enclosed by dashed lines denoted as $F_1$ to $F_4$. Each of the circuits $F_1$ to $F_4$ has a similar construction and includes a well known R-S flip-flop. Referring to the construction of the flip-flops taking $F_1$ as a representative, the circuit comprises NAND gates $N_{11}$ and $N_{12}$. The output terminal $Q_{11}$ of the NAND gate $N_{11}$ is connected to one of the input terminals of the NAND gate $N_{12}$ and the output terminal $Q_{12}$ of said NAND gate $N_{12}$ is connected to one of the input terminals of the NAND gate $N_{11}$. The input terminal $S_1$ of the NAND gate $N_{11}$ forms a set terminal of the flip-flop $F_1$. The input terminal $r_1$ of the NAND gate $N_{12}$ forms a reset terminal. When the set input terminal $S_1$ has a low voltage level, a stabilized state, that is, a set state is established wherein the output terminal $Q_{11}$ provides a high voltage level and the output terminal $Q_{12}$ provides a low voltage level. When the reset terminal $r_1$ is set at a low voltage level, a reset state is attained wherein the output terminals $Q_{11}$ and $Q_{12}$ respectively provide a voltage opposite to the foregoing state.

The set terminal $S_1$ of the flip-flop $F_1$ is connected with an output terminal of a gate circuit $G_{11}$ and the reset terminal $r_1$ is connected with an output terminal of a gate circuit $G_{12}$. The gate circuit $G_{11}$ is connected of a NAND gate and has a gate input terminal $g_{11}$ and a set input terminal $s_{11}$. Each of the gate circuits $G_{21}$, $G_{22}$, $G_{31}$, $G_{32}$, $G_{41}$ and $G_{42}$ has a similar construction. A circuit $T_{11}$ including a resistor $R_{11}$ and a capacitor $C_{11}$ connected in series, is connected between the output terminal $Q_{11}$ of the flip-flop $F_1$ and ground. The connection point between the resistor $R_{11}$ and the capacitor $C_{11}$ is connected to the gate terminal $g_{21}$ of the gate circuit $G_{21}$. The circuit $T_{11}$ is an integration circuit and constitutes a delay circuit which delays the output signals of the output terminal $Q_{11}$ and applies the delayed output signals to the terminal $g_{21}$ as an input signal. The circuits having the same function as that of the delay circuit $T_{11}$ are shown as blocks $T_{21}$, $T_{31}$, $T_{22}$, $T_{32}$ and $T_{42}$. The delay circuit $T_{21}$ is connected between the output terminal $Q_{21}$ of the flip-flop $F_2$ and the input terminal $g_{31}$ of the gate circuit $G_{31}$. The delay circuit $T_{31}$ is connected between the output terminal $Q_{31}$ of the flip-flop $F_3$ and terminal $g_{41}$ of the gate circuit $G_{41}$. The delay circuit $T_{22}$ is connected between the output terminal $Q_{22}$ of the flip-flop $F_2$ and the terminal $g_{12}$ of the gate circuit $G_{12}$. The delay circuits $T_{32}$ and $T_{42}$ are connected respectively in a similar manner between the output terminals $Q_{32}$ and $Q_{42}$ of the flip-flops $F_3$ and $F_4$ and the terminals $g_{22}$ and $g_{32}$ of the gate circuits $G_{22}$ and $G_{32}$ respectively, as illustrated in the drawing. The input terminals $g_{11}$, $s_{11}$, $s_{21}$, $s_{31}$ and $s_{41}$ of the gate circuits $G_{11}$, $G_{21}$, $G_{31}$ and $G_{41}$ are connected to a common terminal $U_1$. The input terminals $s_{12}$, $s_{22}$, $s_{32}$, $s_{42}$ and $g_{42}$ of the gate circuits $G_{12}$, $G_{22}$, $G_{32}$ and $G_{42}$ are connected to the other common terminal $D_1$. A capacitor $C_1$ for delaying a high level input voltage when the same is applied, is connected between the set input terminal $s_1$ of the flip-flop $F_1$ and ground. Capacitors $C_2$, $C_3$ and $C_4$ which may have the same capacitance value, are respectively connected between the reset terminals $r_2$, $r_3$ and $r_4$ of the other flip-flop circuits and ground.

The terminal $U_1$ is an input terminal to which a control signal $P_1$ is applied and the terminal $D_1$ is an input terminal to which another control signal $P_2$ is applied. The control signals $P_1$ and $P_2$ are respectively composed of voltage pulses and are added solely or sequentially as desired. As can be seen from the description of the operation to be made later, the voltage level of the audio signal at the output terminal $A_2$, is increased by the application of the pulse $P_1$ and lowered by the application of the pulse $P_2$. The time constants of the capacitors $C_1$, $C_2$, $C_3$ and $C_4$ should be within such a range that the pulse voltage generated by the application of the pulse $P_1$ or $P_2$ to the output terminals of the gate circuits $G_{11}$, $G_{22}$, $G_{32}$ and $G_{42}$, can be used as set or reset input signals for flip-flop circuits with no substantial decays. Each of the time constants of the delay circuits $T_{11}$, $T_{21}$, $T_{31}$, $T_{22}$, $T_{32}$ and $T_{42}$ should be selected sufficiently greater than the pulse time width $t_1$ and sufficiently shorter than the pulse repeating interval $t_2$.

The operation of the circuit will now be described with reference to FIG. 1. The circuit operation can be understood by considering each of its typical states, that is, an initial state when a voltage from a power source is first supplied and the stabilized conditions are attained, a state after the arrival of the control signal $P_1$ at the terminal $U_1$ and the succeeding state when the control signal $P_2$ arrives at the terminal $D_1$. Since the voltages appearing at each of the terminals are either at a high level or a low level, they are referred to herein as "H" and "L" for the sake of simplicity.

(1) Initial state when only the power source voltage is applied

All of the gate inputs and the set inputs for each of the gate circuits are set at the "L" state and all of the outputs are at the "H" state. However, since a capacitor $C_1$ is connected between the output terminal of the gate circuit $G_{11}$ and ground, the voltage at the set input terminal $s_1$ of the flip-flop $F_1$ does not instantly reach the "H" state but remains at "L" until the capacitor $C_1$ is fully charged. On the other hand, the voltage at the reset input terminal $r_1$ immediately assumes the "H" state. Thus, the flip-flop $F_1$ establishes a set state wherein the output terminal $Q_{11}$ is at the "H" state.

In the flip-flop $F_2$, the reset terminal $r_2$ is also set at the "L" state by the delay function of the capacitor $C_2$. The output terminal $Q_{22}$ thus takes "H" and the other output terminal $Q_{21}$ takes "L" to thereby establish a reset state. In the similar manner as described above, the flip-flop circuits $F_3$ and $F_4$ also establish the reset state as the flip-flop circuit $F_2$. Thus, connection points $J_1$ becomes "H" and the other connection points $J_2$, $J_3$ and $J_4$ are at ground potential by way of the flip-flop circuits $F_2$, $F_3$ and $F_4$. Therefore, the audio signals applied through an input terminal $A_1$ is divided and taken off from an output terminal $A_2$ at a level divided by the ratio between the resistance values of the resistor $R_1$ and the resistor $R_2$. The voltage developed at the output terminal $Q_{11}$ is delayed in the delay circuit $T_{11}$ and then applied to the gate terminal $g_{21}$ of the gate circuit $G_{21}$ to set a "H" voltage on said terminal $g_{21}$. Since other flip-flop circuits assume the reset state and the output terminals $Q_{22}$, $Q_{32}$ and $Q_{42}$ thereof assume an "H" state. The gate terminals $g_{12}$, $g_{22}$ and $g_{32}$ also assume an "H" voltage or state after a delay in the delay circuits $T_{22}$, $T_{32}$ and $T_{42}$.

(2) A state when a first pulse $P_1$ is applied to the terminal $U_1$

In the gate $G_{11}$, both of the gate terminal $g_{11}$ and the set terminal $s_{11}$ are set at an "H" state to thereby develop a "L" voltage at the output thereof, which renders the voltage at the set input terminal of the flip-flop $F_1$ to "L". In the gate circuit $G_{12}$, the output terminal assumes "H" since the gate terminal $g_{12}$ is set to "H" as described above and the set terminal $s_{12}$ remains at "L". Therefore, the flip-flop $F_1$ establishes its set state, that is, the same state as set forth in item (1) above where the set terminal $s_1$ has a "L" voltage and the reset input terminal $r_1$ has a "H" voltage. In the gate circuit $G_{21}$, the gate terminal $g_{21}$ is kept at "H" and a pulse capable of setting the set terminal $s_{21}$ to "H" arrives at said terminal thereby rendering the output thereof "L". Since the reset terminal $r_2$ remains "H", the flip-flop $F_2$ establishes the set state when the set input is rendered "L" as described above, wherein the output terminal $Q_{21}$ takes "H" and the output terminal $Q_{22}$ takes "L". In the gate circuit $G_{31}$, since the gate terminal $g_{31}$ is set to "L", the output thereof remains "H" even when a pulse is applied to cause the set terminal $s_{31}$ to assume an "H" state. The gate circuit $G_{32}$ keeps its output at "H" since no pulses arrive at the set terminal $s_{32}$ and the gate terminal $g_{32}$ remains "H". As the flip-flop $F_3$ has been kept at its reset state since the application of the power source voltage, there is no change in the operational states. Because the output terminal $Q_{21}$ of the flip-flop $F_2$ at the preceeding stage now changes to "H", a "H" voltage is going to be applied to the gate $g_{31}$. However, since the delay circuit $T_{21}$ is interposed, the gate terminal $g_{31}$ is set "H" not immediately but after the pulse $P_1$ applied to said terminal $s_{31}$, has ended. As the result, the output of the gate circuit $G_{31}$ remains "H" to thereby keep the flip-flop $F_3$ from establishing the set state. Finally, in the gate circuit $G_{41}$, the gate terminal $g_{41}$ remains "L" and the set terminal $s_{41}$ becomes "H" at the arrival of the pulse to thereby cause the output to assume an "H" state. Thus, the flip-flop $F_4$ also remains at its reset state. As the result of the above successive operations, the connection points $J_1$ and $J_2$ take "H" and the connection points $J_3$ and $J_4$ take "L". The audio signal applied through the terminal $A_1$ is taken off from the terminal $A_2$ divided by the ratio between the resistance value of $R_1$ and that of the resistors $R_2$ and $R_3$. Therefore, the signal level at the terminal $A_2$ becomes higher than that obtained in the state described in item (1) above.

(3) A state when the second pulse is applied to the terminal $U_1$

The circuit operations are similar as those described in item (1) above, and the flip-flops $F_1$, $F_2$ and $F_3$ are set while only the flip-flop $F_4$ remains reset. Therefore, only the terminal $J_4$ is grounded and the voltage level of the signal applied to the input terminal $A_1$ is divided by the ratio between the resistance value of $R_1$ and that of the sum of the resistors $R_2$, $R_3$ and $R_4$.

(4) A state when the third pulse is applied to the terminal $U_1$

The flip-flop $F_4$ turns into the set state and thus all of the flip-flops are now brought into the set state. Therefore, the signal applied through the input terminal $A_1$, is divided by the ratio between the resistance value of $R_1$ and that of $R_2$, $R_3$, $R_4$ and $R_5$. Thereafter, the above set state is kept even when further pulses are applied to the terminal $U_1$.

(5) A state when a first pulse $P_2$ is applied to the terminal $D_1$

When a pulse $P_2$ arrives at the terminal $D_1$ under the state wherein all of the flip-flops are kept set, both of the set input terminal $s_{42}$ and the gate terminal $g_{42}$ in the gate circuit $G_{42}$ are set to "H" to develop an output signal at the "L" level at its output terminal. The gate circuit $G_{41}$, develops a "H" output since the set input terminal $s_{41}$ is again "L" although the gate terminal $g_{41}$ remains "H". Therefore, the flip-flop $F_4$ turns into the reset state. The outputs of the gate circuits $G_{32}$, $G_{22}$ and $G_{12}$ remain "H" in spite of the application of the pulse because each of the gate terminals $g_{32}$, $g_{22}$ and $g_{12}$ remains at the "L" level. Thus, the flip-flops $F_1$, $F_2$ and $F_3$ maintain their set state and, as the result, only the connection point $J_4$ is grounded. After the pulse $P_2$ has ended, the voltage at the "H" level developed at the terminal $Q_3$ is applied via the delay circuit $T_{42}$ to the gate terminal $g_{32}$ of the gate circuit $G_{32}$ to attain the same condition as described in item (3) above.

(6) A state when the second pulse $P_2$ is applied to the terminal $D_1$

The set terminal $S_{32}$ and the gate terminal $g_{32}$ of the gate circuit $G_{32}$ are set "H" to turn the output thereof to "L". Therefore, the flip-flop $F_3$ turns into the reset state. Since other flip-flops, $F_1$, $F_2$ and $F_4$ remain with their states unchanged, the connection points $J_3$ and $J_4$ are now grounded. After the end of the pulse $P_2$, the gate terminal $g_{41}$ of the gate circuit $G_{41}$ assumes the "L" state and the gate terminal $g_{22}$ of the gate circuit $G_{22}$ becomes "H", which is the same state as described in item (2) above.

(7) A state when the third pulse $P_2$ is applied to the terminal $D_1$

The output of the gate circuit $G_{22}$ is set to "L" to turn the flip-flop $F_2$ to the reset state. The other flip-flops $F_1$, $F_3$ and $F_4$ are kept in the preceeding states. Therefore, the connection point $J_2$ is grounded. After the end of the pulse, the gate terminal $g_{31}$ is set to "L" and the gate terminal $g_{12}$ is set to "H", which is the same as the initial state described in item (1) attained after the application of the power supply voltage.

(8) A state when the fourth pulse $P_2$ is applied to the terminal $D_1$

Since the gate terminal $g_{12}$ remains "H" and the set terminal $s_{12}$ is now set to "H", the gate circuit $G_{12}$ provides an output signal of the "L" level to thereby turn the flip-flop $F_1$ into the reset state. Accordingly, the terminal $Q_{11}$ becomes "L" and the connection point $J_1$ is grounded. Thus, the audio signal applied at the terminal $A_1$ is grounded and does not appear at the terminal $A_2$. This state is continued, thereafter, even when further pulses $P_2$ are applied to the terminal $D_1$.

The circuit operation has been described with reference to respective states set forth in each of the items (1) through (8). The output states of the flip-flops as described in each of the items are shown as a truth table in FIG. 2 and the states of the voltages set at each of the gate terminals and set terminals in the gate circuits where the operation of each of the flip-flops is stabilized, are illustrated in FIG. 3. It will easily be understood referring to FIG. 2 and FIG. 3, how the circuit shown in FIG. 1 changes its state from a certain established condition to another by way of the successive arrival of the pulses $P_1$ or $P_2$.

In the circuit illustrated in FIG. 1, a capacitor $C_1$ is connected between the set input terminal $s_1$ and ground, and the capacitors $C_2$, $C_3$ and $C_4$ are connected between each of the reset input terminals $r_2$, $r_3$ and $r_4$ of other flip-flops $F_2$, $F_3$ and $F_4$ and ground respectively. The capacitor $C_1$ thus connected, establishes an initial state wherein the flip-flop $F_1$ is preferably brought into the set state when the power source voltage is applied. In a modified circuit, the capacitor $C_2$ may be connected between the set input terminal $s_2$ and ground in a similar manner as the capacitor $C_1$ thereby preferably bringing both of the flip-flops $F_1$ and $F_2$ into the set state after the application of the power source voltage. In such a modified circuit, in other words, the audio signal applied to the terminal $A_1$ is at first taken off from the terminal $A_2$ as a level divided by the ratio between the resistance value of $R_1$ and that of the resistors $R_2$ and $R_3$. The audio signal to be taken off after the application of the power source voltage can thus be set at an intermediate level. This circuit is very convenient for a viewer because when applying the same to a volume control circuit in a television receiver, the volume can be controlled at the intermediate level when the power switch is turned to "on".

Figure 4:
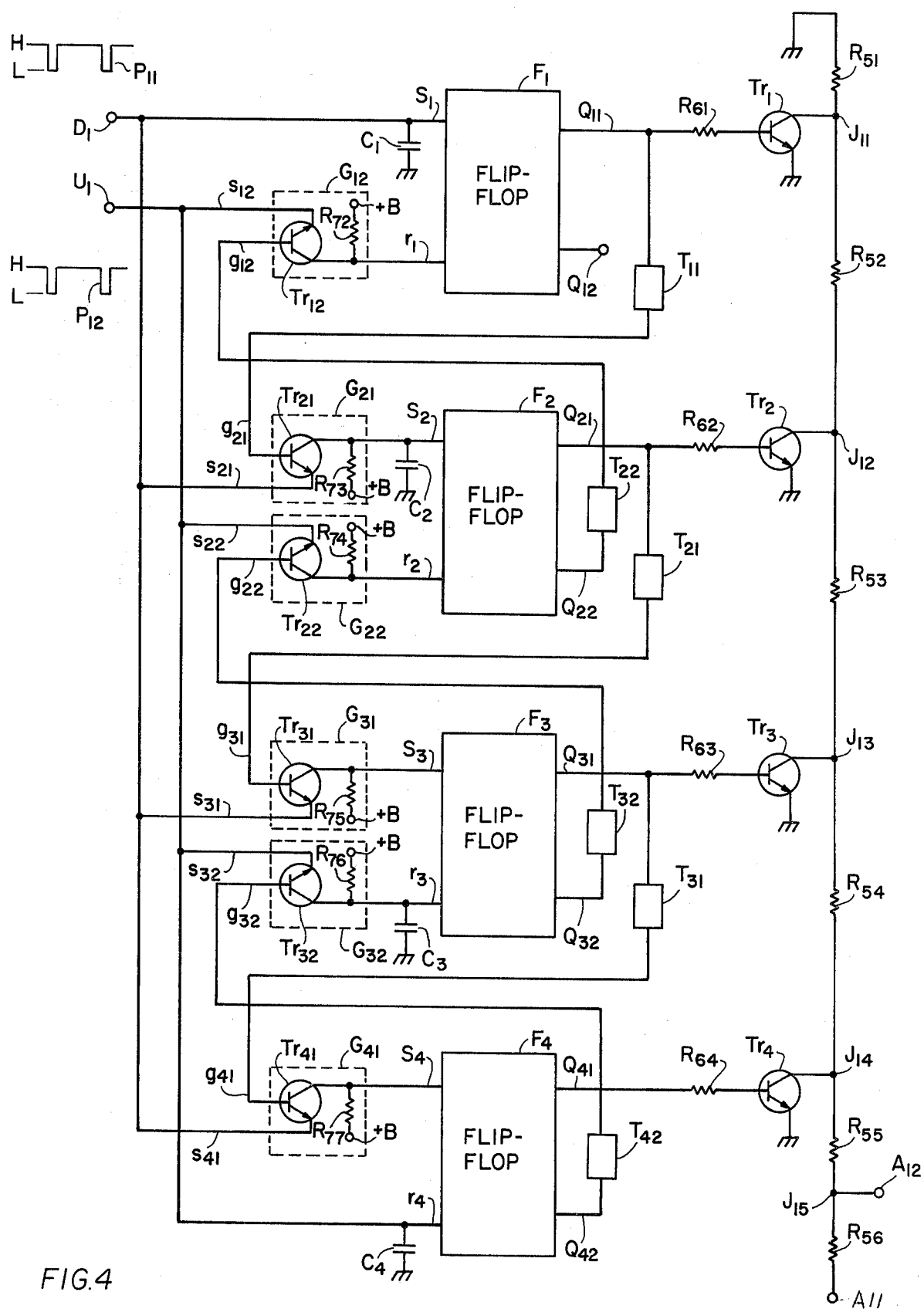
FIG. 4 is a circuit diagram of another preferred embodiment of this invention.

The circuit shown in FIG. 1 may be altered as shown in FIG. 4. The circuit will be described only with respect to the differences in comparison to the embodiment of FIG. 1. The audio signal is applied to a terminal $A_{11}$ and taken off from a terminal $A_{12}$. Since a further resistor $R_{55}$ is connected in the series, the signal level taken off from the output terminal $A_{12}$ is always kept at a certain level without decreasing to zero even when all of the connection points $J_{11}$ through $J_{14}$ are grounded. Transistors $Tr_1$, $Tr_2$, $Tr_3$ and $Tr_4$ are respectively connected between each of the output terminals $Q_{11}$, $Q_{21}$, $Q_{31}$ and $Q_{41}$ of the flip-flops and the connection points $J_{11}$, $J_{12}$, $J_{13}$ and $J_{14}$ corresponding thereto. These transistors operate as switching devices with each of their base electrodes being controlled by the output voltage of the flip-flops. The set input terminal $s_1$ of the flip-flop $F_1$ is directly connected to a common terminal $D_1$. No gate means are interposed therebetween and the reset terminal $r_4$ of the flip-flop $F_4$ is directly connected to the common terminal $U_1$ also with no gate means interposed therebetween. A gate circuit $G_{12}$ has a transistor $Tr_{12}$ the base of which is used as a gate terminal $s_{12}$, the emitter of which is used as a set terminal $\bar{s}_{12}$ and the collector of which is used as an output terminal and supplied with a voltage $B^+$ via a resistor $R_{72}$. The other gate circuits $G_{21}$, $G_{22}$, $G_{31}$, $G_{32}$, and $G_{41}$ have the same construction as the gate circuit $G_{12}$. The control signals $P_{11}$ and $P_{12}$ to be applied to input the terminals $U_1$ and $D_1$ are the respective pulses which have opposite polarities to those of the pulses $P_1$ and $P_2$ shown in FIG. 1. In the circuit shown in FIG. 4, capacitors $C_1$ and $C_2$ are respectively connected between the set input terminals $s_1$ and $s_2$, and the ground, and capacitors $C_3$ and $C_4$ are respectively connected between the reset input terminals $r_3$ and $r_4$ and ground. In the initial state where only the power source voltage is applied, the flip-flops $F_1$ and $F_2$ attain the set state and the flip-flops $F_3$ and $F_4$ attain the reset state, whereby the transistors $Tr_1$ and $Tr_2$ have a "H" base voltage and become saturated to conduct. On the other hand, the transistors $Tr_3$ and $Tr_4$ remain non-conductive. This means that the connection points $J_{11}$ and $J_{12}$ are grounded. Therefore, the audio signal applied through the terminal $A_{11}$ is taken off from the terminal $A_{12}$ divided by the ratio between the resistance value of the resistors $R_{53}$, $R_{54}$, $R_{55}$ and $R_{56}$ at a predetermined intermediate level within the range to be controlled. After the power source voltage is applied, each of the controlling operations of the circuit is started from the above described initial state.

Although the operation of the circuits shown in FIG. 1 and FIG. 4, has been described with reference to the audio signal as an example of the signal to be controlled, the signal may be any other AC current signal or may be a DC voltage. Also, reference has been made to for providing the resistors connected in series the connection points in the series with ground level or with certain reference voltage levels it will be appreciated that impedance elements having a capacitance and/or an inductance may be used instead of the resistors.

FIG. 5 shows a part of a circuit diagram in which impedance elements connected in series shown as blocks 1 to 4 are used instead of the resistors connected in series. The terminal $A_1$ in this embodiment is connected to a circuit which requires an impedance control.

FIG. 6 shows a part of a circuit diagram of another embodiment wherein a ladder type circuit network comprising impedance elements 11 to 19, is applied to the circuit shown in FIG. 1.

Although this invention has thus been described referring to the preferred embodiments thereof, it will be understood that it is intended to cover all modifications and equivalents within the scope of the appended claims.

What is claimed is:

1. A circuit arrangement for the digital control of analog output signal levels, comprising a plurality of impedance elements connected in series to form voltage divider means having a number of connection points between adjacent impedance elements, an analog input terminal and an analog output terminal connected to said voltage divider means, said circuit arrangement further comprising digital control circuit means including memory circuit stages corresponding in number to said number of connection points between adjacent impedance elements, each memory circuit stage having a setting input terminal, a resetting input terminal as well as first and second output terminals for providing different output states, means operatively connecting said first output terminal of each stage to the respective connecting point in said voltage divider means, setting and resetting circuit means operatively connected to the respective setting input terminal and to the respective resetting input terminal of the corresponding memory circuit stage, said setting and resetting circuit means having control input terminal means, first and second digital control signal input means operatively connected to said control input terminal means of said setting and resetting circuit means, first delay circuit means operatively connecting the first output terminal of a preceding memory circuit stage to the appropriate control input terminal means of the next following memory circuit stage, second delay circuit means operatively connecting the second output terminal of a following memory circuit stage to the appropriate control input terminal means of the next preceding memory circuit stage, and further delay circuit means operatively connected to selected ones of said setting and resetting input terminals of said memory circuit stages, whereby different potential levels may be applied to said connection points in response to digital control input signals supplied respectively to said second and first digital control signal input means.

2. The circuit arrangement of claim 1, wherein said memory circuit stages comprise at least a first stage and a last stage, said setting and resetting circuit means comprising for each of said memory circuit stages a setting logic circuit gate connected to the setting input terminal of the corresponding stage and a resetting logic circuit gate connected to the resetting input terminal of the corresponding stage, said setting logic circuit gate of the first stage having two inputs connected to said first digital control signal input means, said resetting logic circuit gate of the last stage having two inputs connected to said second digital control signal input means, said resetting logic circuit gate of the first stage having a signal input connected to said second digital control signal input means and a gate input connected to the next stage, said setting logic circuit gate of the last stage having a signal input connected to said first digital control signal input means and a gate input connected to the preceding stage.

3. The circuit arrangement of claim 2, wherein said logic circuit gates of memory circuit stages between said first and last stage have gate inputs connected to said second output terminal of an adjacent stage, and signal inputs connected respectively to said first and second digital control signal input means.

4. The circuit arrangement of claim 1, wherein each of said memory circuit stages comprises an R-S flip-flop circuit.

5. The circuit arrangement of claim 1, wherein each of said first and second delay circuit means comprises an integration circuit having a resistor and a capacitor.

6. The circuit arrangement of claim 5, wherein, for charging the capacitor each of said integration circuits has a time constant which is greater than the pulse width and shorter than the pulse repetition interval of first and second digital control signals applied to said first and second digital control signal input means.

7. The circuit arrangement of claim 6, wherein each of said further delay circuit comprises capacitor means connected between selected ones of the setting and resetting input terminals of said memory circuit stages and ground.

8. The circuit arrangement of claim 1, wherein said means operatively connecting said first output terminal to the respective connecting point comprise a switching circuit connected between each of said first output terminals of said memory circuit stages and the respective connection point formed in said voltage divider means.

9. The circuit arrangement of claim 1, wherein said memory circuit stages comprise at least a first stage and a last stage, wherein said setting circuit means of the first stage directly connect the setting input terminal of the first stage to said first digital control signal input means, and wherein said resetting circuit means of the last stage directly connect the resetting input terminal of said last stage to said second digital control signal input means.

10. The circuit arrangement of claim 9, wherein each of said memory circuit stages comprises flip-flop circuit means including an R-S flip-flop circuit.

11. The circuit arrangement of claim 10, wherein each of said first and second delay circuit means comprises an integration circuit having a resistor and a capacitor.

12. The circuit arrangement of claim 11, wherein, for charging the capacitor, each of said integration circuits has a time constant which is greater than the pulse width and shorter than the pulse repetition interval of first and second digital control signals applied to said first and second digital control signal input means.

13. The circuit arrangement of claim 12, wherein each of said further delay circuit means comprises capacitor means connected between selected ones of the setting and resetting input terminals of said memory circuit stages and ground.

* * * * *